United States Patent
Azzano et al.

(10) Patent No.: US 11,761,985 B2
(45) Date of Patent: Sep. 19, 2023

(54) CALIBRATION USING FLIPPED SENSOR FOR HIGHLY DYNAMIC SYSTEM

(71) Applicant: Analog Devices International Unlimited Company, Limerick (IE)

(72) Inventors: Guilhem Azzano, Dooradoyle (IE); Jens Sorensen, Oceanside, CA (US)

(73) Assignee: Analog Devices International Unlimited Company, Limerick (IE)

( * ) Notice: Subject to any disclaimer, the term of this patent is extended or adjusted under 35 U.S.C. 154(b) by 37 days.

(21) Appl. No.: 17/592,488

(22) Filed: Feb. 3, 2022

(65) Prior Publication Data

US 2022/0252641 A1 Aug. 11, 2022

Related U.S. Application Data

(60) Provisional application No. 63/147,716, filed on Feb. 9, 2021.

(51) Int. Cl.
*G01R 15/14* (2006.01)
*G01R 19/00* (2006.01)

(52) U.S. Cl.
CPC ......... *G01R 15/14* (2013.01); *G01R 19/0092* (2013.01)

(58) Field of Classification Search
CPC ............................ G01R 15/14; G01R 19/0092
See application file for complete search history.

(56) References Cited

U.S. PATENT DOCUMENTS

| | | | |
|---|---|---|---|
| 6,154,379 A * | 11/2000 | Okita | H02M 7/48 363/40 |
| 6,768,301 B1 | 7/2004 | Hohe et al. | |
| 7,193,388 B1 * | 3/2007 | Skinner | H02M 7/53873 318/807 |
| 7,818,890 B2 | 10/2010 | Durie et al. | |
| 7,902,775 B2 | 3/2011 | Narumi et al. | |
| 9,046,562 B2 | 6/2015 | Cummings et al. | |

(Continued)

FOREIGN PATENT DOCUMENTS

| | | |
|---|---|---|
| JP | 2003-215220 A | 7/2003 |
| JP | 2008-164297 A | 7/2008 |

OTHER PUBLICATIONS

[No Author Listed], 1- and 2-Axis Magnetic Sensors HMC1001/ 1002/1021/1022. Honeywell, HMC1021/1022 Datasheet. Aug. 2008, Form #900248 Rev C. 15 pages.

*Primary Examiner* — Dominic E Hawkins
(74) *Attorney, Agent, or Firm* — Wolf, Greenfield & Sacks, P.C.

(57) ABSTRACT

Techniques are described for calibrating sensors for use in systems in the presence of offset. Sensors may be used to generate sense signals which represent true signals that are part of a system. When the sensors are not calibrated, inefficiency due to offset can be introduced into a system that incorporates the generated sense signal. Flipping techniques may be used to mitigate offset. Applicant has appreciated that when the sensor gains are mismatched, the offset calibration associated with a sensor is not independent from the offset calibration associated with the other sensors. Some of the flipping techniques described herein account for gain mismatch by flipping the polarity of each sensor in a one-at-a-time fashion, and by combining the results in a common system of equations to determine the gain mismatch and the offset of each sensor.

20 Claims, 11 Drawing Sheets

(56) References Cited

U.S. PATENT DOCUMENTS

| | | |
|---|---|---|
| 9,419,611 B2 | 8/2016 | Motz |
| 9,465,088 B2 | 10/2016 | Putinier |
| 9,476,915 B2 | 10/2016 | Ausserlechner |
| 9,547,048 B2 | 1/2017 | Romero |
| 9,574,867 B2 | 2/2017 | Uberti et al. |
| 9,606,189 B2 | 3/2017 | Ausserlechner |
| 9,658,295 B2 | 5/2017 | van Veldhoven et al. |
| 9,753,097 B2 | 9/2017 | Romero |
| 10,120,042 B2 | 11/2018 | Diaconu et al. |
| 10,224,857 B2 | 3/2019 | Yamakawa et al. |
| 10,641,799 B2 | 5/2020 | Schrom et al. |
| 10,739,165 B2 | 8/2020 | Schmitt |
| 11,187,763 B2 | 11/2021 | Schmitt et al. |
| 2012/0140532 A1* | 6/2012 | Tallam .............. H02M 7/53875 363/37 |
| 2013/0063059 A1* | 3/2013 | Chi ..................... H02P 27/08 318/400.13 |
| 2014/0265986 A1* | 9/2014 | Gebregergis ........ H02P 23/0027 318/494 |
| 2019/0245429 A1* | 8/2019 | Iwazaki ................ H02M 1/088 |
| 2019/0331776 A1 | 10/2019 | Aotake et al. |

\* cited by examiner

1st measurement set:
- Sensor 102: unflipped polarity
- Sensor 104: unflipped polarity
- Sensor 106: unflipped polarity ⇒ $i_{AmeasureFp} = i_{Ap} \times K_a + i_{AOffset}$
$i_{BmeasureFp} = i_{Bp} \times K_b + i_{BOffset}$ ⎬ First plurality of samples
$i_{CmeasureFp} = i_{Cp} \times K_c + i_{COffset}$

2nd measurement set:
- Sensor 102: flipped polarity
- Sensor 104: unflipped polarity
- Sensor 106: unflipped polarity ⇒ $i_{AmeasureFn} = i_{An} \times K_a - i_{AOffset}$
$i_{BmeasureFn} = i_{Bn} \times K_b + i_{BOffset}$ ⎬ Second plurality of samples
$i_{CmeasureFn} = i_{Cn} \times K_c + i_{COffset}$

CALIBRATION USING FLIPPED SENSOR FOR HIGHLY DYNAMIC SYSTEM

CROSS-REFERENCE TO RELATED APPLICATION

This application claims the benefit under 35 U.S.C. § 119(e) of U.S. Provisional Application Ser. No. 63/147,716, entitled "ONLINE CALIBRATION USING FLIPPED SENSOR FOR HIGHLY DYNAMIC SYSTEM," filed on Feb. 9, 2021, under Attorney Docket No. G0766.70339US00, which is hereby incorporated herein by reference in its entirety.

BACKGROUND

Magnetic sensors are used to sense current in an alternating current (AC) system and can generate a sense signal. In some situations, magnetic sensors are used as part of a control system. Magnetic sensors may generate sense signals in response to current being used to drive a load in a control system.

SUMMARY OF THE DISCLOSURE

Some embodiments relate to techniques for calibrating sensors for use in systems in the presence of offset. Sensors may be used to generate sense signals which represent true signals that are part of a system. When the sensors are not calibrated, inefficiency due to offset can be introduced into a system that incorporates the generated sense signal. Flipping techniques may be used to mitigate offset. Applicant has appreciated that when the sensor gains are mismatched, the offset calibration associated with a sensor is not independent from the offset calibration associated with the other sensors. Some of the flipping techniques described herein account for gain mismatch by flipping the polarity of each sensor in a one-at-a-time fashion, and by combining the results in a common system of equations to determine the gain mismatch and the offset of each sensor.

Other embodiments relate to a method for sensing one or more true signals in an electrical system. The method comprises receiving a plurality of sense signals from a plurality of sensors, each of the plurality of sense signals representing a respective true signal of the one or more true signals; determining a first offset associated with a first sensor of the plurality of sensors and a first gain mismatch associated with the first sensor, wherein determining the first offset and the first gain mismatch comprises: sampling each of the plurality of sense signals during a first time interval to obtain a first plurality of samples; flipping a polarity of the first sensor while keeping a polarity of a second sensor of the plurality of sensors unflipped; with the polarity of the first sensor flipped and the polarity of the second sensor unflipped, sampling each of the plurality of sense signals during a second time interval to obtain a second plurality of samples; and determining the first offset and the first gain mismatch using the first plurality of samples and the second plurality of samples; and generating a plurality of compensated signals using the first offset.

Other embodiments relate to an apparatus for sensing one or more true signals in an electrical system, the apparatus comprising a controller. The controller is configured to receive a plurality of sense signals from a plurality of sensors, each of the plurality of sense signals representing a respective true signal of the one or more true signals; determine a first offset associated with a first sensor of the plurality of sensors and a first gain mismatch associated with the first sensor, wherein determining the first offset and the first gain mismatch comprises: sampling each of the plurality of sense signals during a first time interval to obtain a first plurality of samples; flipping a polarity of the first sensor while keeping a polarity of a second sensor of the plurality of sensors unflipped; with the polarity of the first sensor flipped and the polarity of the second sensor unflipped, sampling each of the plurality of sense signals during a second time interval to obtain a second plurality of samples; and determining the first offset and the first gain mismatch using the first plurality of samples and the second plurality of samples; and generate a plurality of compensated signals using the first offset.

Other embodiments relate to an apparatus for driving a load coupled to a multi-phase electrical system, the apparatus comprising a plurality of sensors, each sensor of the plurality of sensors being coupled to a respective phase line of the multi-phase electrical system; and a controller. The controller is configured to receive a plurality of sense signals from the plurality of sensors; determine a first offset associated with a first sensor of the plurality of sensors, wherein determining the first offset comprises: sampling each of the plurality of sense signals during a first time interval to obtain a first plurality of samples; flipping a polarity of the first sensor while keeping a polarity of a second sensor of the plurality of sensors unflipped; with the polarity of the first sensor flipped and the polarity of the second sensor unflipped, sampling each of the plurality of sense signals during a second time interval to obtain a second plurality of samples; and determining the first offset using the first plurality of samples and the second plurality of samples; and generate a plurality of compensated signals using the first offset.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

I. Overview

Aspects of the present application relate to techniques for calibrating sensors for use in multi-phase systems in the presence of offset. A sensor that may be calibrated using the techniques described herein includes a magnetic sensor, which is often used as part of closed loop control systems for electrical equipment. Magnetic sensors are often also used in highly dynamic systems and systems that require non-intrusive calibration.

Magnetic sensors generate a sense signal in response to a magnetic field that is produced by current to be measured. The sense signal may be for example a sense voltage or sense current. Magnetic sensors (and other types of sensors) suffer from a phenomenon referred to as "signal offset" or simply "offset." An offset is a spurious signal (e.g., a voltage) introduced by a sensor regardless of the quantity to be measured. Offset combines with the sense signal additively, and typically occurs in the form of a direct current (DC) voltage. In the presence of offset, therefore, there is a difference between the actual sensor output and the desired sensor output. Unfortunately, the amount of offset is generally not known a priori, which makes it difficult to estimate the desired sensor output based solely on the actual sensor output. Offset can arise due to a variety of reasons, including for example due to a mismatch in the resistances of the resistors of a Wheatstone bridge. A Wheatstone bridge is often used in conjunction with a sensor to improve the accuracy of the sensor. A Wheatstone bridge includes a plurality of resistors. By design, the resistors have matched resistances. In practice, however, the resistances may be slightly mismatched, which leads to signal offset.

Offset can be mitigated in some circumstances using flipping techniques. Flipping involves changing the polarity of a sensor by 180 degrees during operation, which reverses the sensitivity of the sensor. In certain instances, for example, when the measured signal is a known periodic signal, it is possible to capture enough samples to distinguish the alternating current (AC) signal from the DC component using flipping. The DC component, in such a case, can be measured before and after flipping the sensor, which allows for the extraction of the offset measurement out of the DC component. By reversing the sensitivity of a sensor when the change in current to be measured is known or calculable, the change in the sense signal due to offset can be determined.

A multi-phase system is a type of AC electrical system used in power generation, transmission, and distribution. Multi-phase systems include multiple channels such that the signal of each channel has a predefined phase relationship with respect to the signals of the other channels. An example of a multi-phase system is a three-phase system, in which three conductors each carry an alternating current that has a phase difference of 120 degrees from the other two currents. The voltage peak of one conductor is one third of a cycle ahead of one other conductor and one third of a cycle behind the other conductor because of the 120-degree phase difference. With such a phase difference, power transfer to a balanced load can be constant. Three-phase systems are often used to power certain types of loads, such as motors used in elevators or other applications. Control loops are often used with multi-phase systems to control power distribution to the load. A control loop relies on a sensor (e.g., a magnetic sensor) to monitor the currents provided to the load. Unfortunately, offset can negatively impact the accuracy of a control loop, which in turn can reduce the efficiency of the load.

Applicant has appreciated that conventional flipping techniques are not suitable for use in connection with multi-phase systems. First, conventional flipping techniques are unable to determine the impact of offset on each channel in such a system individually. This is because a control loop distributes any offset across all channels in an unpredictable manner. Second, the fundamental frequency of the current to be measured in systems, such as multi-phase and highly dynamic systems, can be in the same range as the flipping frequency. When this occurs, the current rate of change of the fundamental frequency may dominate instantaneous measurements. Due to the non-predictability of currents in such systems, a spectral distinction between the fundamental frequency and the flipping frequency may not be possible.

Applicant has developed flipping techniques that address at least some of the aforementioned challenges in various embodiments. The flipping techniques described herein can be used with gain-matched sensor or with gain-unmatched sensor. Gain (also referred to in some contexts as sensitivity) is the measure of the ability of a sensor to sense a signal of interest (referred to herein as "true signal"). Gain is expressed as a ratio between the sensor output signal and the signal of interest. Gain can be represented as a ratio of output voltage to input voltage, as a ratio of output current to input voltage, as a ratio of output voltage to input current or as a ratio of output current to input current, among other options. Applicant has appreciated that when the gains of the sensor are matched, the offset of each phase-channel (also referred to as phase-line) can be determined independently of the offset of the other channels. Leveraging this appreciation, one technique developed by Applicant involves flipping the polarity of one sensor while keeping the polarity of the other sensors unchanged. This technique produces an equation for one offset that can be solved without having to solve for the offset of the other sensors and without having to integrate the result over time and independently of the true current. With those characteristics, the equation can be solved in a relatively short period of time, e.g., in a few milliseconds. Solving the system in such a short period of time may be beneficial in applications requiring real-time sensing, such as in closed loop control systems. This technique can be applied to each sensor of the sensing device.

Applicant has further appreciated that when gains are mismatched, the offset calibration associated with a sensor is no longer independent from the true currents measured by the other sensors.

Aspects of the present application relate to techniques for calibrating sensors (e.g., magnetic sensor) when the sensors exhibit gain mismatch. The techniques developed by Applicant account for gain mismatch by flipping the polarity of each sensor in a one-at-a-time fashion, and by combining the results in a common system of equations to determine the gain and the offset of each sensor. For example, flipping the polarity of each sensor may follow a pattern in which the polarity of the first sensor is flipped, then the polarity of the second sensor is flipped, then the polarity of the third sensor is flipped, and then the flipping sequence is repeated. Although this results in additional computations relative to the gain-matched case, such computations can be performed without having to integrate the result over time, thereby enabling real-time sensing, and independently from the true currents flowing through the system.

Accordingly, aspects of the present application relate to an apparatus for sensing a plurality of true signals in a multi-phase electrical system (e.g., a two-phase system, a three-phase system, a four-phase system, or more generally an n-phase system where n is greater than one). The apparatus may include a plurality of sensors (e.g., magnetic sensors or other types of sensors) each coupled to a line of the multi-phase system and a controller configured to execute a method. The method may involve receiving a plurality of sense signals from the plurality of sensors, where each of the plurality of sense signals represents the true signal present at a respective line; determining a first offset associated with a first sensor of the plurality of sensors and a first gain mismatch associated with the first sensor; and generating a plurality of compensated signals using the first offset.

Determining the first offset and the first gain mismatch, in turn, may involve i) sampling each of the plurality of sense signals during a first time interval to obtain a first plurality of samples; ii) flipping a polarity of the first sensor while keeping a polarity of a second sensor of the plurality of sensors unflipped; iii) with the polarity of the first sensor flipped and the polarity of the second sensor unflipped, sampling each of the plurality of sense signals during a second time interval to obtain a second plurality of samples; and iv) determining the first offset and the first gain mismatch using the first plurality of samples and the second plurality of samples.

II. Multi-Phase Systems

Figure 1A:
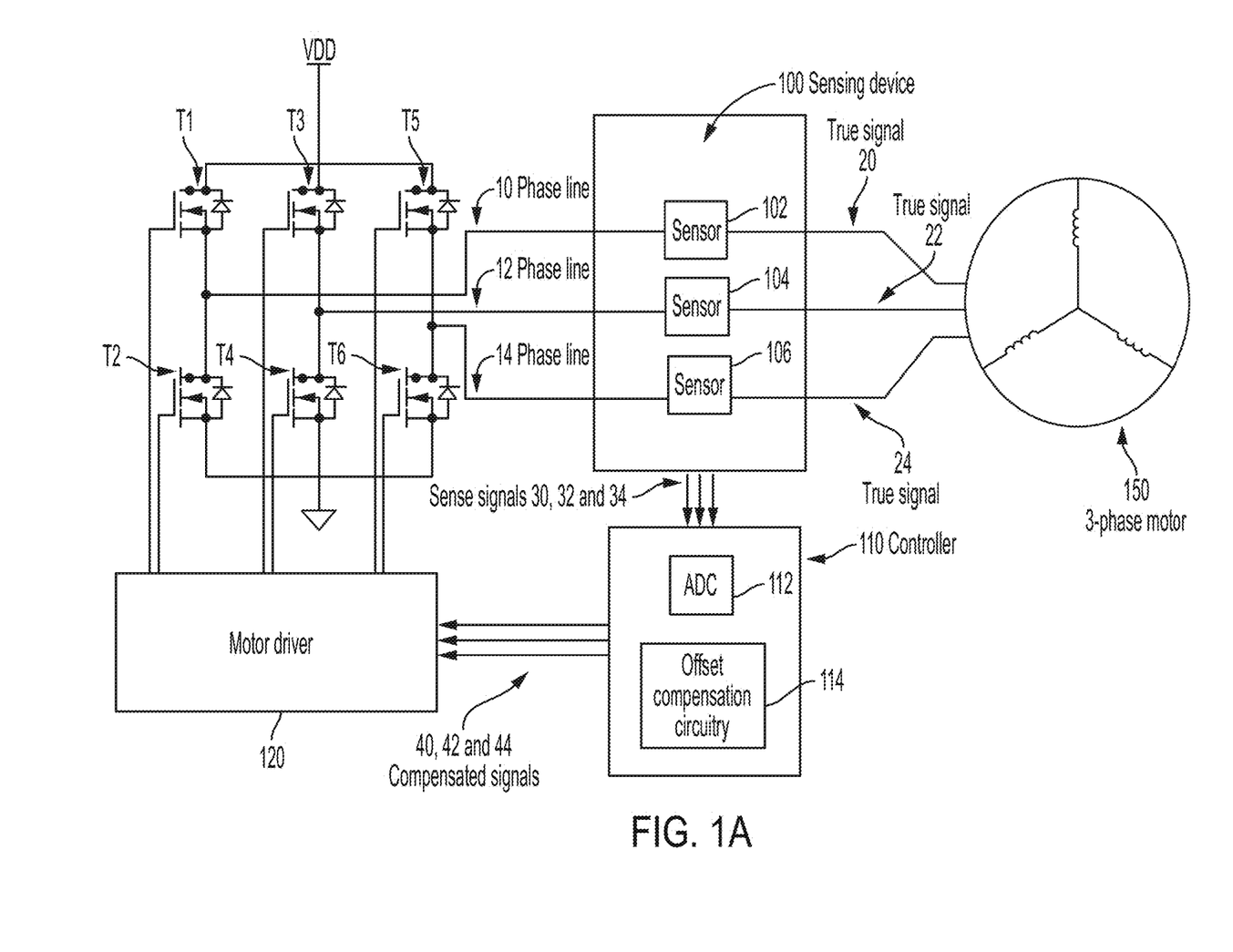
FIG. 1A is a block diagram illustrating a three-phase electrical system coupled to a three-phase motor, in accordance with some embodiments.

FIG. 1A is a block diagram illustrating an example of a three-phase system including a control loop and a sensing device, in accordance with some embodiments. The system of FIG. 1A includes a sensing device 100, a controller 110, a motor driver 120, and a three-phase motor 150. Sensing device 100 includes sensors 102, 104, and 106. Controller 110 includes analog-to-digital converter (ADC) 112 and offset compensation circuitry 114. While FIG. 1A illustrates a three-phase system with a three-phase motor, the techniques described herein can be applied to any n-phase system where n is greater than one. The control loop includes closed-loop feedback designed such that the load (three-phase motor 150 in this example) is driven in accordance with a three-phase system. The loop detects and compensates for deviations from ideal signals for driving the load. Deviations from the ideal case can decrease the power efficiency of the load and cause the control loop to struggle. Compensating for deviations from the ideal can involve determining offsets introduced by sensing device 100 and can allow the system to recover to drive the load more efficiently.

As part of the control loop illustrated in FIG. 1A, sensing device 100 provides sense signals 30, 32, and 34 to controller 110. Controller 110 provides compensated signals 40, 42, and 44 to motor driver 120. Motor driver 120 controls transistors T1, T2, T3, T4, T5, and T6. Based on the output of transistors T1 and T2, T3 and T4, and T5 and T6, phase lines 10, 12, and 14 support an AC signal with a respective phase delay. More specifically, phase lines 10, 12, and 14 carry true signals 20, 22, and 24 which are input to three-phase motor 150 to drive the motor. Sensing device 100 generates and provides sense signals 30, 32, and 34 to controller 110 based on the signal carried by phase lines 10, 12, and 14.

Phase lines 10, 12, and 14 support true signals 20, 22, and 24 with a phase delay such that power transfer to a balanced load can be constant. Phase lines 10, 12, and 14 may be wires, cables, transmission lines, conductive traces, or any component capable of carrying a signal. In an n-phase system, n phase lines may be used, and the phase delay of the supported signal may be equal to approximately 360 degrees divided by n. Accordingly, in the three-phase system of FIG. 1A, three phase lines are included for three signals with a phase delay equaling 120 degrees. In another embodiment where n equals five, for example, there may be five phase lines for five signals with a phase delay of 72 degrees.

Figure 1B:
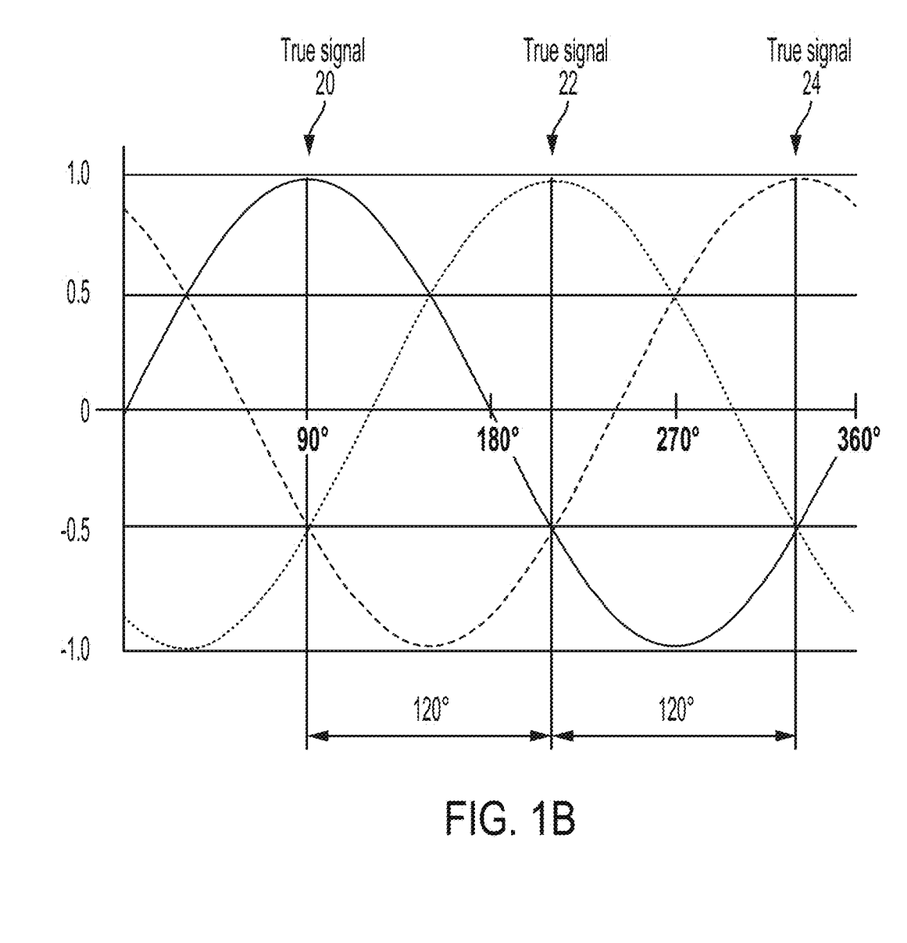
FIG. 1B is a plot illustrating an exemplary set of true signals, in accordance with some embodiments.

Referring to FIG. 1B, true signals 20, 22, and 24 may include a voltage or current, and when presented graphically in the time domain along a horizontal axis, may be expressed as a sinusoidal waveform (though other waveforms are possible). Each signal 20, 22, and 24 is 120 degrees out of phase with each of the other signals. The phase delay refers to the angle, in degrees or radians, by which the signal waveform has laterally shifted from other signals. In an n-phase system, n true signals may be used, and in the three-phase system of FIG. 1A, three true signals 20, 22, and 24 are included in the control loop, such as those illustrated in FIG. 1B.

Returning to FIG. 1A, each sensor 102, 104, and 106 has an associated gain, which can be represented as a ratio of output current to input voltage, such as (Amperes/Volts) or (A/V), for example. Gain can also be represented as other ratios, such as a ratio of output voltage to input voltage (V/V), output voltage to input current (V/A), or output current to input current (A/A). In some embodiments, sensors 102, 104, and 106 have matched gains. In other embodiments, sensors 102, 104, and 106 have mismatched gains. While sensing device 100 includes three sensors in FIG. 1A, sensing device 100 may include any number of sensors, such as n sensors. In some embodiments, sensors 102, 104, and 106 are magnetic sensors, which generate a sense signal in response to a magnetic field that is produced by true signals 20, 22, and 24. However, sensors 102, 104, and 106 may be any suitable sensor. Sensors 102, 104, and 106 are coupled to a respective phase line of the multi-phase system and may be positioned in any suitable location to sense the AC signal carried by phase lines 10, 12, and 14. Sensors 102, 104, and 106 may suffer from offset when generating sense signals 30, 32, and 34.

Figure 1C:
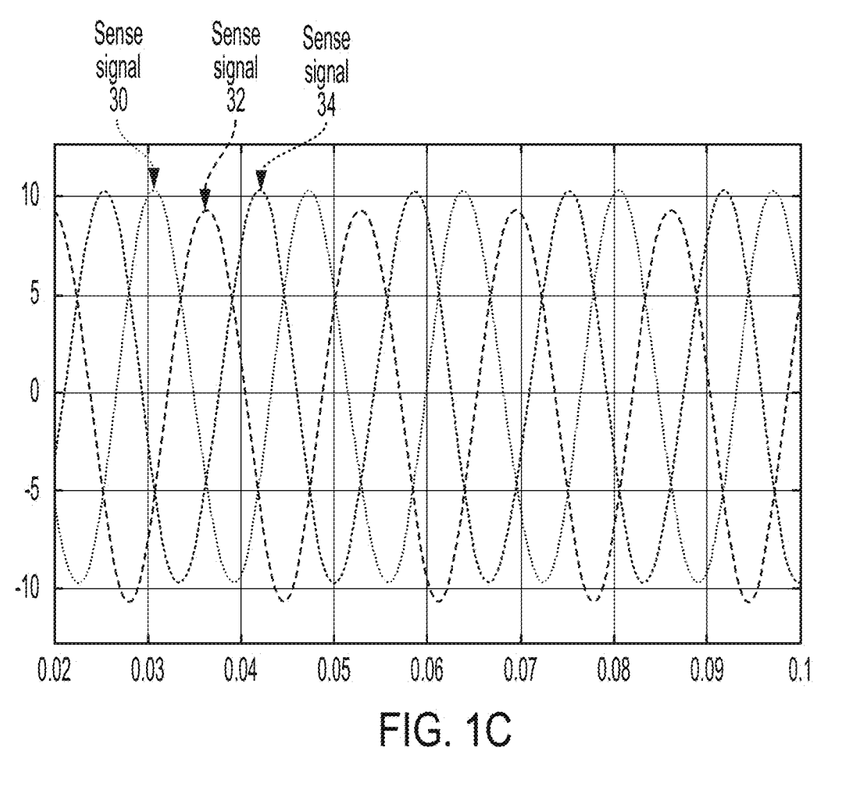
FIG. 1C is a plot illustrating an exemplary set of sense signals, in accordance with some embodiments.

FIG. 1C illustrates an example of sense signals 30, 32, and 34 presented graphically in the time domain along a horizontal axis. Sense signals 30, 32, and 34 may include a sense voltage or sense current, and when presented graphically in the time domain along a horizontal axis, sense signals 30, 32, and 34 may each be expressed as a sinusoidal waveform (though other waveforms are possible). Since sensors 102, 104, and 106 of FIG. 1A may suffer from offset, sense signals 30, 32, and 34, such as those shown in FIG. 1C, may not be the desired sensor output. Accordingly, true signals 20, 22, and 24, such as those illustrated in FIG. 1B, may not be accurately represented by sense signals 30, 32, and 34. In FIG. 1C, for example, sense signal 32 suffers from offset, which is a spurious signal that combines with the ideal sense signal and typically occurs in the form of a DC voltage or a slowly varying spurious component. Offset can therefore cause the DC component to be non-zero, and the offset value is generally not known a priori. Over time, if offset is not compensated for, true signals 20, 22, and 24 can increasingly deviate from the true signals shown in FIG. 1B, thus negatively affecting power transfer to the load.

In the three-phase system of FIG. 1A, controller 110 includes ADC 112 and offset compensation circuitry 114. ADC 112 may be any suitable ADC capable of converting an analog signal to a digital signal. Once converted, the signal is in a digital form that can be processed or transmitted. Offset compensation circuitry 114 may be any circuitry capable of being used to determine a compensation value based on offset(s) introduced by the sensing device 100. Controller 110 uses ADC 112 and offset compensation circuitry 114 to generate compensated signals 40, 42, and 44 based on sense signals 30, 32 and 34. As part of the control loop in FIG. 1A, controller 110 receives sense signals 30, 32, and 34 as input, and controller 110 outputs compensated signals 40, 42, and 44 to motor driver 120 based on the sensed offset(s). Controller 110 may also be configured to determine a gain mismatch associated with each sensor 102, 104, and 106. Accordingly, when generating compensated signals 40, 42, and 44, controller 110 may use the gains associated with each sensor 102, 104, and 106 alongside their offsets.

Motor driver 120 may include a processor and circuitry configured to use transistors T1, T2, T3, T4, T5, and T6 to control current flow. Controlling the current flow may comprise controlling what direction the current is flowing, and correspondingly, the transistors may act as switches for the current flow. Transistors T1, T2, T3, T4, T5, and T6 are not limited to any particular type of transistor and may include metal-oxide-semiconductor field-effect transistors (MOSFET). In the non-limiting example of FIG. 1A, the motor driver 120 controls six transistors. However, the aspects described herein are not limited to any specific number of transistors.

In FIG. 1A, three-phase motor 150 is illustrated with a wye connection. The aspects described herein are not limited to a particular motor or motor connection. The techniques described herein can be applied to any n-phase load, and in the case of a motor, the motor connection may be any suitable connection.

III. Sensor Flipping

Figure 2A:
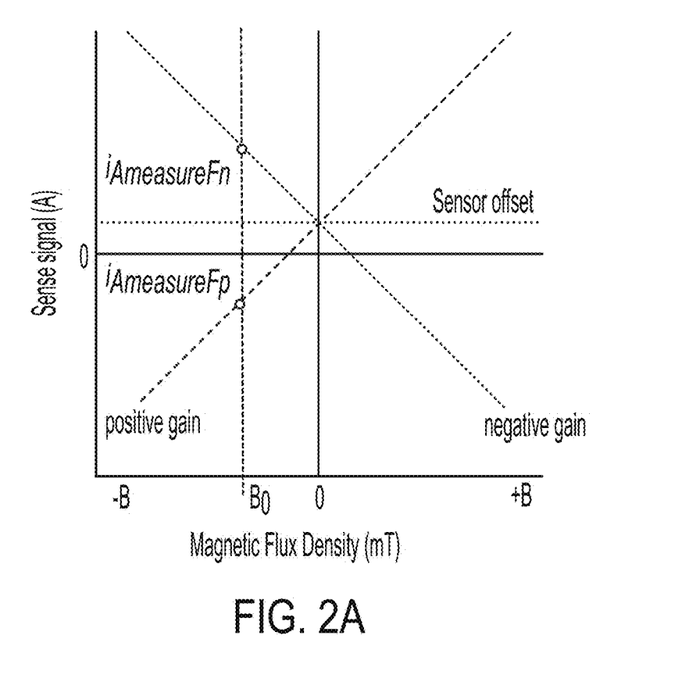
FIG. 2A is a plot illustrating the response of a representative magnetic sensor with unflipped polarity and with flipped polarity, in accordance with some embodiments.

Flipping is a technique that involves inverting the polarity of a sensor. For example, flipping the polarity of a sensor may involve inverting the gain of a sensor from a positive value to a negative value, or from a negative value to a positive value. Alternatively, flipping the polarity of a sensor may involve inverting the offset of a sensor from a positive value to a negative value, or from a negative value to a positive value. Yet alternatively, flipping the polarity of a sensor may involve inverting the orientation of a true signal (e.g., inverting the true current flowing through the sensor from one direction to the opposite direction). Accordingly, a sensor the polarity of which is flipped is a sensor that has gone through a transition from one state to the opposite state (where the state can indicate the gain, offset or current orientation). Similarly, a sensor the polarity of which is unflipped is a sensor that has not gone through a transition. FIG. 2A illustrates an example associated with a magnetic sensor. FIG. 2A is a plot illustrating the amplitude of a representative sense signal as a function of the magnetic flux density, in accordance with some embodiments. The plot includes two curves, one representing the sensor response with positive gain and one representing the sensor response with negative gain. Assuming a constant magnetic flux density Bo, sampling the output of the sensor with the polarity unflipped produces current $i_{AmeasurementFp}$ and after being flipped the output of the sensor produces current $i_{AmeasurementFn}$. As can be further appreciated from FIG. 2A, the sensor suffers from offset in that a zero magnetic flux density produces non-zero currents. With reference to FIG. 2A, flipping the polarity of a sensor may involve flipping the gain from positive to negative or from negative to positive.

IV. Matched Gains

Figure 2B:
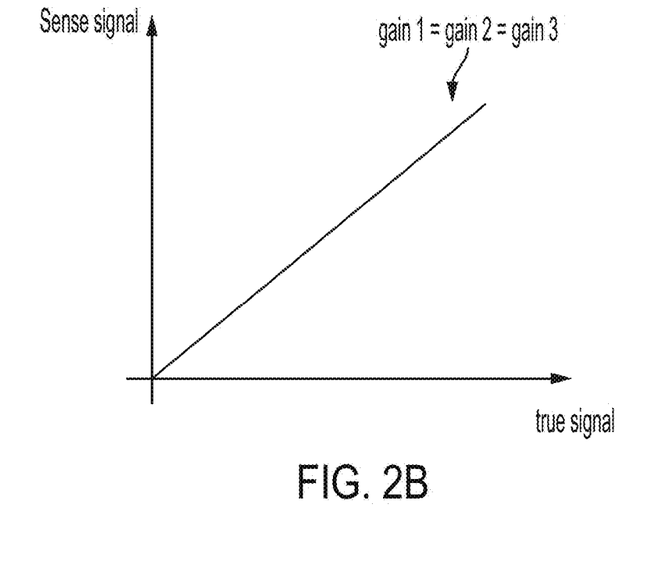
FIG. 2B is a plot illustrating matched gains associated with a plurality of sensors, in accordance with some embodiments.

Some embodiments relate to flipping techniques for determining and compensating for offset in the presence of matched gains. FIG. 2B is a plot illustrating the amplitude of a sense signal as a function of the amplitude of the corresponding true signal, in accordance with some embodiments. In this example, the curves associated with the three sensors of FIG. 1A overlap with one another, indicating that the gains of the sensors are matched. The gain associated with sensor 102 (gain 1) equals the gain of sensor 104 (gain 2) and the gain of sensor 106 (gain 3).

Applicant has appreciated that when the gains of the sensor are matched, the offset of each phase-line can be determined independently of the true currents flowing in the other phase-lines. Leveraging this appreciation, some embodiments involve flipping the polarity of one sensor while keeping the polarity of the other sensors unchanged. In these embodiments, an equation is produced for one offset that can be solved without having to solve for the offset of the other sensors.

Figure 2C:
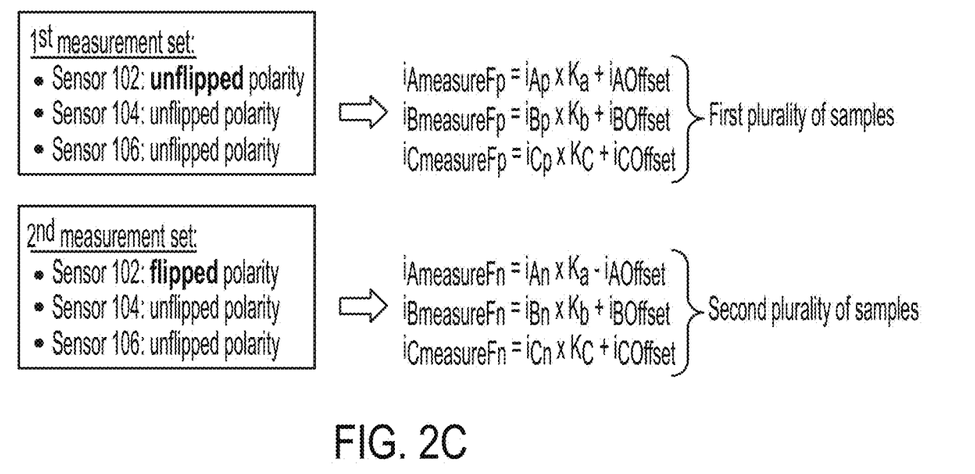
FIG. 2C is a block diagram illustrating a procedure for determining the offset of sensor, in accordance with some embodiments.

FIG. 2C is a block diagram illustrating a procedure for determining the offset of sensor 102, in accordance with some embodiments. The procedure involves producing a first plurality of samples and a second plurality of samples by taking two measurement sets. In some embodiments, the samples of a measurement set are obtained simultaneously. In the first measurement set, sensor 102 produces a sample with the polarity unflipped, sensor 104 produces a sample with the polarity unflipped and sensor 106 produces a sample with the polarity unflipped. The outputs of sensors 102, 104 and 106 are $i_{AmeasurementFp}$, $i_{BmeasurementFp}$ and $i_{CmeasurementFp}$, respectively. Here, $i_{AP}$ represents the true current flowing through phase line 10 when sensor 102 is unflipped, $i_{BP}$ represents the true current flowing through phase line 12 when sensor 102 is unflipped and $i_{CP}$ represents the true current flowing through phase line 14 when sensor 102 is unflipped. Further, $K_a$ represents the gain of sensor 102, $K_b$ represents the gain of sensor 104 and $K_c$ represents the gain of sensor 106. Further still, $i_{AOffset}$ represents the offset associated with sensor 102, $i_{BOffset}$ represents the offset associated with sensor 104 and $i_{COffset}$ represents the offset associated with sensor 106.

In the second measurement set, sensor 102 produces a sample with the polarity flipped, sensor 104 produces a sample with the polarity unflipped and sensor 106 produces a sample with the polarity unflipped. Notably, only the polarity of sensor 102 has been flipped. The outputs of sensors 102, 104 and 106 with sensor 102 being flipped are $i_{AmeasurementFn}$, $i_{BmeasurementFn}$ and $i_{CmeasurementFn}$, respectively. Here, $i_{An}$ represents the current flowing through phase line 10 when sensor 102 is flipped, $i_{Bn}$ represents the current flowing through phase line 12 when sensor 102 is flipped and $i_{Cn}$ represents the current flowing through phase line 14 when sensor 102 is flipped.

The change in the output of sensor 102 from the first measurement set to the second measurement set can be expressed as follows:

$$iAmeasure\_Fp - iAmeasure\_Fn = Ka(iAp - iAn) + 2iAOffset$$

To isolate the offset $i_{AOffset}$ from this equation, the change in the outputs of sensors 104 and 106 from the first measurement set to the second measurement set can be taken. In a three-phase system, the following expressions apply:

$$iAp = -iBp - iCp$$

$$iAn = -iBn - iCn$$

from which the following expressions can be obtained:

$$Ka(iAp - iAn) = Ka(-iBp - iCp + iBn + iCn)$$

and $$Ka(iAp - iAn) = Ka((iB\text{measure}Fn - iB\text{measure}Fp)/Kb + (iC\text{measure}Fn - iC\text{measure}Fp)/Kc)$$

Solving for $i_{AOffset}$, the following expression is obtained:

$$2iA\text{Offset} = (iA\text{measure}Fp - iA\text{measure}Fn) - Ka((iB\text{measure}Fn - iB\text{measure}Fp)/Kb + (iC\text{measure}Fn - iC\text{measure}Fp)/Kc)$$

Lastly, the following expression is obtained by assuming $K_a = K_b = K_c$ (matched gains):

$$iA\text{Offset} = (((iA\text{measure}Fp - iA\text{measure}Fn) + (iB\text{measure}Fp - iB\text{measure}Fn)(iC\text{measure}Fp - iC\text{measure}Fn)))/2$$

As can be appreciated from this expression, the offset associated with sensor 102 ($i_{AOffset}$) is independent from the offsets associated with sensors 104 and 106 ($i_{BOffset}$ and $i_{COffset}$) and independent from the true currents flowing through the phase lines.

The procedure of FIG. 2C may be repeated to determine the other offsets. Once the offsets have been determined, offset compensation circuitry 114 can compensate the loop for such offsets. For example, offset compensation circuitry 114 may generate compensation signals 40, 42 and 44, which, in some embodiments, are offset-free (or, at least, have substantially attenuated offsets).

V. Unmatched Gains

Figure 3A:
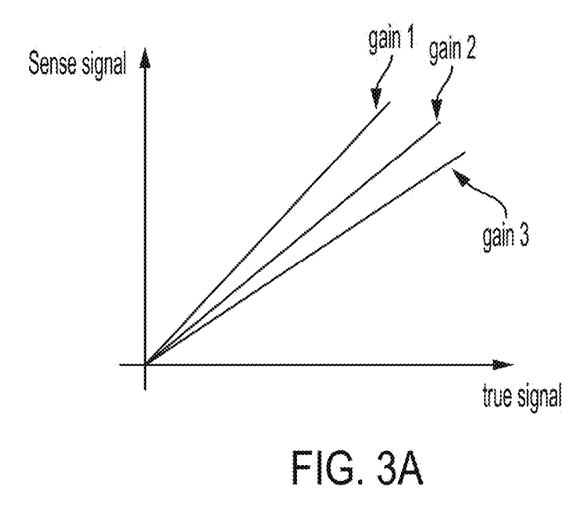
FIG. 3A is a plot illustrating unmatched gains associated with a plurality of sensors, in accordance with some embodiments.

Some embodiments relate to flipping techniques for determining and compensating for offset in the presence of unmatched gains. FIG. 3A is a plot illustrating the amplitudes of the sense signals as a function of the amplitude of the corresponding true signal, in accordance with some embodiments. In this example, the curves associated with the three sensors of FIG. 1A do not overlap with one another, indicating that the gains of the sensors are unmatched. The gain associated with sensor 102 (gain 1) differs from the gain of sensor 104 (gain 2) and from the gain of sensor 106 (gain 3).

Applicant has appreciated that when gains are mismatched, the offset calibration associated with a sensor is no longer independent from true signals associated with the other sensors. Accordingly, solving for one offset requires that the other offsets also be solved. Some embodiments relate to techniques for calibrating sensors when the sensors exhibit gain mismatch. These embodiments are configured to determine the gain mismatches of the sensors in addition to their offsets. Further, in these embodiments, the polarities of the sensors may be flipped in a one-at-a-time fashion, which allows one to obtain separate equations for the different offsets.

Figure 3B:
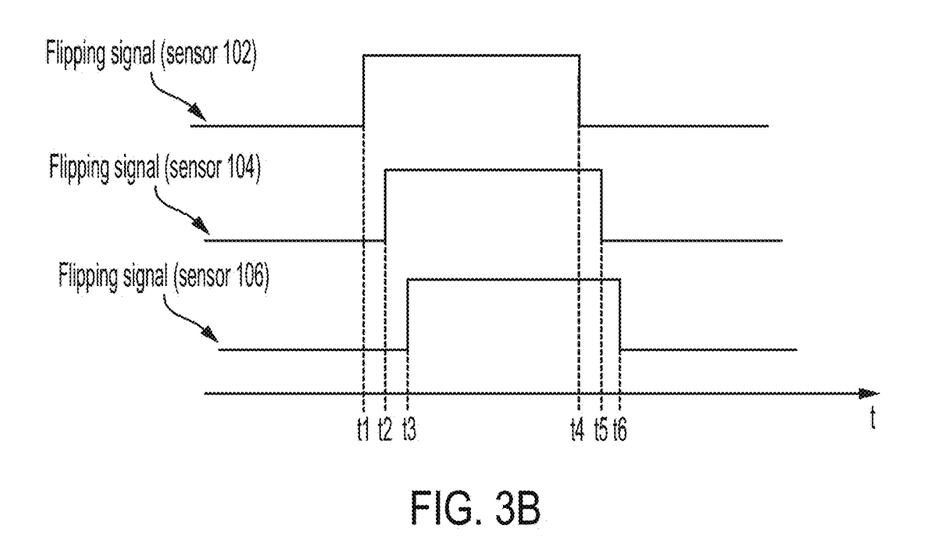
FIG. 3B is a plot illustrating a first exemplary flipping sequence, in accordance with some embodiments.
Figure 3C:
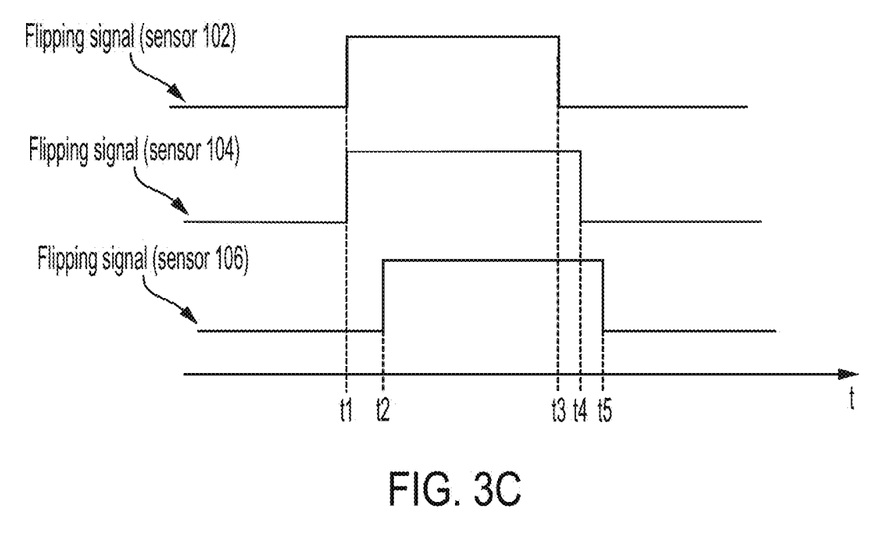
FIG. 3C is a plot illustrating a second exemplary flipping sequence, in accordance with some embodiments.
Figure 3D:
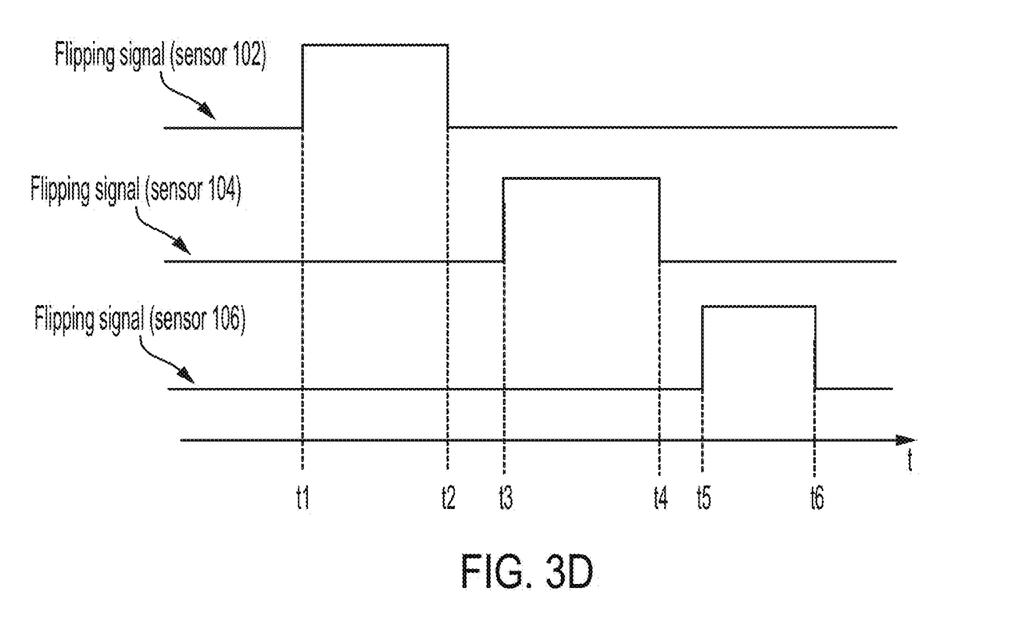
FIG. 3D is a plot illustrating a third exemplary flipping sequence, in accordance with some embodiments.

FIG. 3B-3D illustrate three examples of how to flip the sensors in one-at-a-time fashion, in accordance with some embodiments. Other schemes are also possible. In the example of FIG. 3B, all sensors are unflipped prior to $t_1$. At $t_1$, sensor 102 is flipped. At $t_2$, sensor 104 is flipped. At $t_3$, sensor 106 is flipped. Between $t_3$ and $t_4$, all sensors remain flipped. At $t_4$, sensor 102 reverts back to the unflipped state. At $t_5$, sensor 104 reverts back to the unflipped state. At $t_6$, sensor 106 reverts back to the unflipped state. The procedure associated with this diagram involves taking five sets of measurements. The first measurement set is taken between $t_1$ and $t_2$. The second measurement set is taken between $t_2$ and $t_3$. The third measurement set is taken between $t_3$ and $t_4$. The fourth measurement set is taken between $t_4$ and $t_5$. The fifth measurement set is taken between $t_5$ and $t_6$. Each measurement set produces three samples, one for each sensor (in the case of a three-phase system, otherwise, one sample for each of n sensors). The samples obtained using this procedure are reported in the following matrix, where each column represents a measurement set, and each row represents a sensor.

| iAmFn1 | iAmFn4 | iAmFn7 | iAmFn6 | iAmFn3 |
|---|---|---|---|---|
| iBmFn1 | iBmFn4 | iBmFn7 | iBmFn6 | iBmFn3 |
| iCmFn1 | iCmFn4 | iCmFn7 | iCmFn6 | iCmFn3 |

It will be assumed that i) the sum of the samples of each column equals zero; and ii) gains and offsets are constant across the six measurement sets. Under these assumptions, there is a set of equations in five unknowns. The five unknowns are Kb/Ka, Kc/Ka, $i_{AOffset}$, $i_{BOffset}$ and $i_{COffset}$ (two gains mismatches and three offsets). Here, the quantities Kb/Ka and Kc/Ka represent the gain mismatches of the second and third sensors relative to the first sensor, respectively. Solving these equations produces the following expressions:

$$Kb/Ka = -(iBmFn1iCmFn3 - iBmFn3iCmFn1 + iBmFn1iCmFn4 - iBmFn4iCmFn1 - iBmFn3iCmFn6 + iBmFn6iCmFn3 - iBmFn4iCmFn6 + iBmFn6iCmFn4)/ (iAmFn1iCmFn3 - iAmFn3iCmFn1 + iAmFn1iCmFn4 - iAmFn4iCmFn1 - iAmFn3iCmFn6 + iAmFn6iCmFn3 - iAmFn4iCmFn6 + iAmFn6iCmFn4)$$

$$Kc/Ka = (iBmFn1iCmFn3 - iBmFn3iCmFn1 + iBmFn1iCmFn4 - iBmFn4iCmFn1 - iBmFn3iCmFn6 + iBmFn6iCmFn3 - iBmFn4iCmFn6 + iBmFn6iCmFn4)/ (iAmFn1iBmFn3 - iAmFn3iBmFn1 + iAmFn1iBmFn4 - iAmFn4iBmFn1 - iAmFn3iBmFn6 + iAmFn6iBmFn3 - iAmFn4iBmFn6 + iAmFn6iBmFn4)$$

$$iA\text{Offset} = (iAmFn6 - iAmFn7)/2 + (Ka(iBmFn6 - iBmFn7))/(2Kb) + (Ka(iCmFn6iCmFn7))/(2Kc)$$

$$iB\text{Offset} = (-iBmFn4 - iBmFn6)/2 - (Kb(iAmFn4 + iAmFn6))/(2Ka) - (Kb(iCmFn4 + iCmFn6))/(2Kc)$$

$$iC\text{Offset} = (iCmFn4 - iCmFn7)/2 + (Kc(iAmFn4 - iAmFn7))/(2Ka) + (Kc(iBmFn4iBmFn7))/(2Kb)$$

Once the offsets and the gain mismatches have been determined, offset compensation circuitry 114 can compensate the loop. For example, offset compensation circuitry 114 may generate compensation signals 40, 42 and 44, which, in some embodiments, are offset-free (or, at least, have substantially attenuated offsets).

In the example of FIG. 3C, all sensors are unflipped prior to $t_1$. At $t_1$, sensors 102 and 104 are flipped. At $t_2$, sensor 106 is flipped. Between $t_2$ and $t_3$, all sensors remain flipped. At $t_3$, sensor 102 reverts back to the unflipped state. At $t_4$, sensor 104 reverts back to the unflipped state. At $t_5$, sensor 106 reverts back to the unflipped state.

In the example of FIG. 3D, sensor 102 is flipped at $t_1$ and reverts back to the unflipped state at $t_2$. Sensor 104 is flipped at $t_3$ and reverts back to the unflipped state at $t_4$. Sensor 106 is flipped at is and reverts back to the unflipped state at $t_6$.

Figure 4:
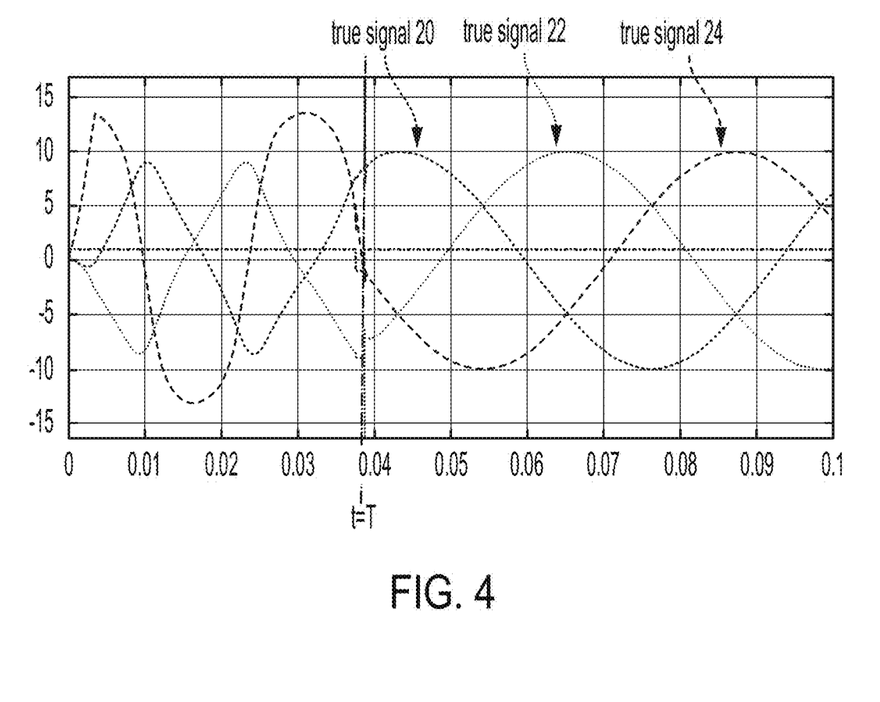
FIG. 4 is a plot illustrating an exemplary set of true signals before and after compensation, in accordance with some embodiments.

FIG. 4 is a plot illustrating representative true signals depicted as a function of time. Prior to t=T, the control loop struggles and is unable to produce true signals reflecting the ideal case depicted in FIG. 1B. Immediately before t=T, the procedure described in connection with FIG. 3B is activated. As a result, the true signals converge to the ideal case following t=T, thus efficiently driving the load.

VI. Additional Remarks

Aspects of the technology described herein may provide one or more benefits, some of which have been previously described. Now described are some examples of such benefits. It should be appreciated that not all aspects and embodiments necessarily provide all of the benefits now described. Further, it should be appreciated that aspects of the technology described herein may provide additional benefits to those now described.

Aspects of the technology described herein allow control loops for multi-phase systems to transfer power to a load efficiently notwithstanding that the sensors may suffer from signal offset and notwithstanding that the sensor may exhibit different gains.

The terms "approximately", and "about" may be used to mean within ±20% of a target value in some embodiments, within ±10% of a target value in some embodiments, within ±5% of a target value in some embodiments, and within ±2% of a target value in some embodiments. The terms "approximately," "substantially," and "about" may include the target value.

What is claimed is:

1. A method for sensing one or more true signals in an electrical system, the method comprising:
   receiving a plurality of sense signals from a plurality of sensors, each of the plurality of sense signals representing a respective true signal of the one or more true signals;
   determining a first offset associated with a first sensor of the plurality of sensors and a first gain mismatch associated with the first sensor, wherein determining the first offset and the first gain mismatch comprises:
   sampling each of the plurality of sense signals during a first time interval to obtain a first plurality of samples;
   flipping a polarity of the first sensor while keeping a polarity of a second sensor of the plurality of sensors unflipped;
   with the polarity of the first sensor flipped and the polarity of the second sensor unflipped, sampling each of the plurality of sense signals during a second time interval to obtain a second plurality of samples; and
   determining the first offset and the first gain mismatch using the first plurality of samples and the second plurality of samples; and
   generating a plurality of compensated signals using the first offset.

2. The method of claim 1, wherein the electrical system is a multi-phase electrical system having a plurality of phase lines, and wherein each sensor of the plurality of sensors is coupled to a respective phase line of the plurality of phase lines.

3. The method of claim 1, wherein determining the first offset and the first gain mismatch further comprises:
   flipping the polarity of the second sensor; and
   with the polarity of the second sensor flipped, sampling each of the plurality of sense signals during a third time interval to obtain a third plurality of samples, and
   wherein determining the first offset and the first gain mismatch using the first plurality of samples and the second plurality of samples comprises determining the first offset and the first gain mismatch using the first plurality of samples, the second plurality of samples and the third plurality of samples.

4. The method of claim 3, wherein:
   flipping the polarity of the second sensor comprises flipping the polarity of the second sensor while keeping the polarity of the first sensor flipped.

5. The method of claim 1, further comprising:
   determining a second offset associated with the second sensor using the first plurality of samples and the second plurality of samples,
   wherein generating the plurality of compensated signals using the first offset comprises generating the plurality of compensated signals using the first offset and the second offset.

6. The method of claim 1, wherein:
   flipping the polarity of the first sensor while keeping the polarity of the second sensor of the plurality of sensors unflipped comprises flipping the polarity of the first sensor while keeping polarities of all other sensors of the plurality of sensors unflipped; and
   sampling each of the plurality of sense signals during the second time interval comprises sampling each of the plurality of sense signals during the second time interval with the polarity of the first sensor flipped and the polarities of all other sensors of the plurality of sensors unflipped.

7. The method of claim 1, further comprising driving a load coupled to the electrical system using the plurality of compensated signals.

8. The method of claim 1, wherein the first time interval and the second time interval partially overlap with one another.

9. An apparatus for sensing one or more true signals in an electrical system, the apparatus comprising:
   a controller configured to:
   receive a plurality of sense signals from a plurality of sensors, each of the plurality of sense signals representing a respective true signal of the one or more true signals;
   determine a first offset associated with a first sensor of the plurality of sensors and a first gain mismatch associated with the first sensor, wherein determining the first offset and the first gain mismatch comprises:
   sampling each of the plurality of sense signals during a first time interval to obtain a first plurality of samples;
   flipping a polarity of the first sensor while keeping a polarity of a second sensor of the plurality of sensors unflipped;
   with the polarity of the first sensor flipped and the polarity of the second sensor unflipped, sampling each of the plurality of sense signals during a second time interval to obtain a second plurality of samples; and
   determining the first offset and the first gain mismatch using the first plurality of samples and the second plurality of samples; and generate a plurality of compensated signals using the first offset.

10. The apparatus of claim 9, wherein the electrical system is a multi-phase electrical system having a plurality of phase lines, and wherein each sensor of the plurality of sensors is coupled to a respective phase line of the plurality of phase lines.

11. The apparatus of claim 9, wherein determining the first offset further comprises:
flipping the polarity of the second sensor; and
with the polarity of the second sensor flipped, sampling each of the plurality of sense signals during a third time interval to obtain a third plurality of samples, and
wherein determining the first offset and the first gain mismatch using the first plurality of samples and the second plurality of samples comprises determining the first offset and the first gain mismatch using the first plurality of samples, the second plurality of samples and the third plurality of samples.

12. The apparatus of claim 11, wherein the controller is configured to:
flip the polarity of the second sensor while keeping the polarity of the first sensor flipped.

13. The apparatus of claim 10, wherein the controller is further configured to:
determine a second offset associated with the second sensor using the first plurality of samples and the second plurality of samples,
wherein generating the plurality of compensated signals using the first offset comprises generating the plurality of compensated signals using the first offset and the second offset.

14. The apparatus of claim 9, wherein:
flipping the polarity of the first sensor while keeping the polarity of the second sensor of the plurality of sensors unflipped comprises flipping the polarity of the first sensor while keeping polarities of all other sensors of the plurality of sensors unflipped; and
sampling each of the plurality of sense signals during the second time interval comprises sampling each of the plurality of sense signals during the second time interval with the polarity of the first sensor flipped and the polarities of all other sensors of the plurality of sensors unflipped.

15. The apparatus of claim 9, wherein the controller is further configured to drive a load couplable to the electrical system using the plurality of compensated signals.

16. The apparatus of claim 9, wherein the first time interval and the second time interval partially overlap with one another.

17. An apparatus for driving a load coupled to a multi-phase electrical system, the apparatus comprising:
a plurality of sensors, each sensor of the plurality of sensors being coupled to a respective phase line of the multi-phase electrical system; and
a controller configured to:
receive a plurality of sense signals from the plurality of sensors;
determine a first offset associated with a first sensor of the plurality of sensors, wherein determining the first offset comprises:
sampling each of the plurality of sense signals during a first time interval to obtain a first plurality of samples;
flipping a polarity of the first sensor while keeping a polarity of a second sensor of the plurality of sensors unflipped;
with the polarity of the first sensor flipped and the polarity of the second sensor unflipped, sampling each of the plurality of sense signals during a second time interval to obtain a second plurality of samples; and
determining the first offset using the first plurality of samples and the second plurality of samples; and
generate a plurality of compensated signals using the first offset.

18. The apparatus of claim 17, wherein:
the multi-phase electrical system is a three-phase electrical system, and
the load comprises a three-phase motor.

19. The apparatus of claim 17, wherein the plurality of sensors comprises a plurality of magnetic sensors.

20. The apparatus of claim 17, wherein the controller is further configured to:
determine a first gain mismatch associated with the first sensor using the first plurality of samples and the second plurality of samples,
wherein generating the plurality of compensated signals using the first offset comprises generating the plurality of compensated signals using the first offset.

* * * * *